US006987055B2

(12) United States Patent
Blomiley et al.

(10) Patent No.: US 6,987,055 B2
(45) Date of Patent: Jan. 17, 2006

(54) METHODS FOR DEPOSITION OF SEMICONDUCTOR MATERIAL

(75) Inventors: Eric R. Blomiley, Boise, ID (US); Gurtej S. Sandhu, Boise, ID (US); Cem Basceri, Boise, ID (US); Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 10/755,000

(22) Filed: Jan. 9, 2004

(65) Prior Publication Data

US 2005/0153551 A1    Jul. 14, 2005

(51) Int. Cl.
*H01L 21/20* (2006.01)
*H01L 21/36* (2006.01)

(52) U.S. Cl. ............... 438/478; 438/627; 438/485; 438/479; 438/488; 438/680; 438/46; 438/584

(58) Field of Classification Search ............... 438/478, 438/627, 486, 481, 488, 734, 297, 301
See application file for complete search history.

(56) References Cited

U.S. PATENT DOCUMENTS

| 5,037,775 | A  | * | 8/1991  | Reisman ............ 438/488 |
| 5,622,559 | A  | * | 4/1997  | Goto et al. ............ 117/89 |
| 6,159,852 | A  |   | 12/2000 | Nuttall et al. |
| 6,342,421 | B1 |   | 1/2002  | Mitani et al. |
| 6,627,260 | B2 |   | 9/2003  | Derderian et al. |
| 6,645,835 | B1 | * | 11/2003 | Yamoto et al. ............ 438/503 |
| 6,900,115 | B2 | * | 5/2005  | Todd ............ 438/478 |

| 2002/0022347 | A1 |   | 2/2002  | Park et al. |
| 2003/0045075 | A1 |   | 3/2003  | Joo et al. |
| 2003/0176047 | A1 | * | 9/2003  | Doan et al. ............ 438/478 |
| 2003/0186515 | A1 | * | 10/2003 | Dean et al. ............ 438/478 |
| 2004/0171238 | A1 | * | 9/2004  | Arena et al. ............ 438/507 |
| 2005/0066892 | A1 | * | 3/2005  | Dip et al. ............ 118/715 |

FOREIGN PATENT DOCUMENTS

WO    2005/ 000566    1/2005

OTHER PUBLICATIONS

Ratsch et al., "Nucleation theory and the early stages of thin film growth" ©2003 American Vacuum Society, S96-S109 pages.
Oda, K. et al., "$Si_{1-x}Ge_x$ Selective Epitaxial Growth for Ultra-High-Speed Self-Aligned HBTs", Thin Solid Films 369 (2000), pp. 358-361.

(Continued)

*Primary Examiner*—B. William Baumeister
*Assistant Examiner*—Igwe U. Anya
(74) *Attorney, Agent, or Firm*—Wells St. John P.S.

(57) ABSTRACT

The invention includes a method for selective deposition of semiconductor material. A substrate is placed within a reaction chamber. The substrate comprises a first surface and a second surface. The first and second surfaces are exposed to a semiconductor material precursor under conditions in which growth of semiconductor material from the precursor comprises a lag phase prior to a growth phase, and under which it takes longer for the growth phase to initiate on the second surface than on the first surface. The exposure of the first and second surfaces is conducted for a time sufficient for the growth phase to occur on the first surface, but not long enough for the growth phase to occur on the second surface.

53 Claims, 9 Drawing Sheets

OTHER PUBLICATIONS

Nishizawa, J. et al., "Molecular Layer Epitaxy of Silicon", Journal of Crystal Growth 99 (Jan. 1990), pp. 502-505.

Kim, H. et al., "Low Temperature Selective Si Epitaxy by Reduced Pressure Chemical Vapor Deposition Introducing Periodic Deposition and Etching Cycles with $SiH_4$, $H_2$ and HCl", Mat.Res.Soc. Symp.Proc.vol. 609 (Apr. 2000), pp. A8.2.1-A8.2.6.

Utsumi, Y. "Synchrotron Radiation-Excited Si Photoepitaxy Using Gas-Source MBE", Optoelectronics-Devices and Technologies vol. 11, No. 1 (Mar. 1996), pp. 23-42.

Murota, J. et al., "Low-Temperature Silicon Selective Deposition and Epitaxy on Silicon Using the Thermal Decomposition of Silane Under Ultraclean Environment", Appl.Phys.Lett. 54 (Mar. 13, 1989), pp. 1007-1009.

* cited by examiner

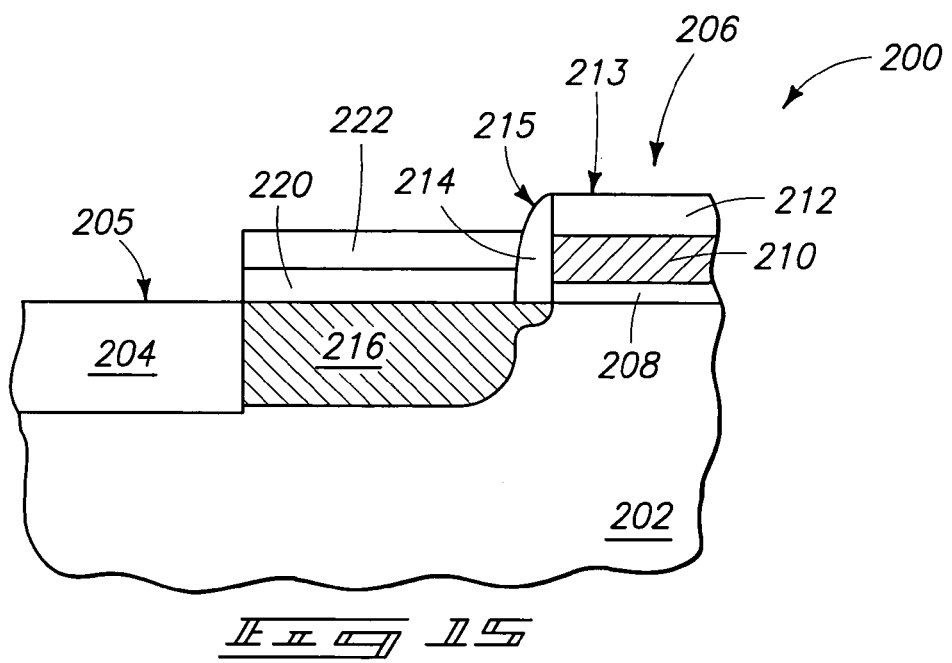
_FIG 15_
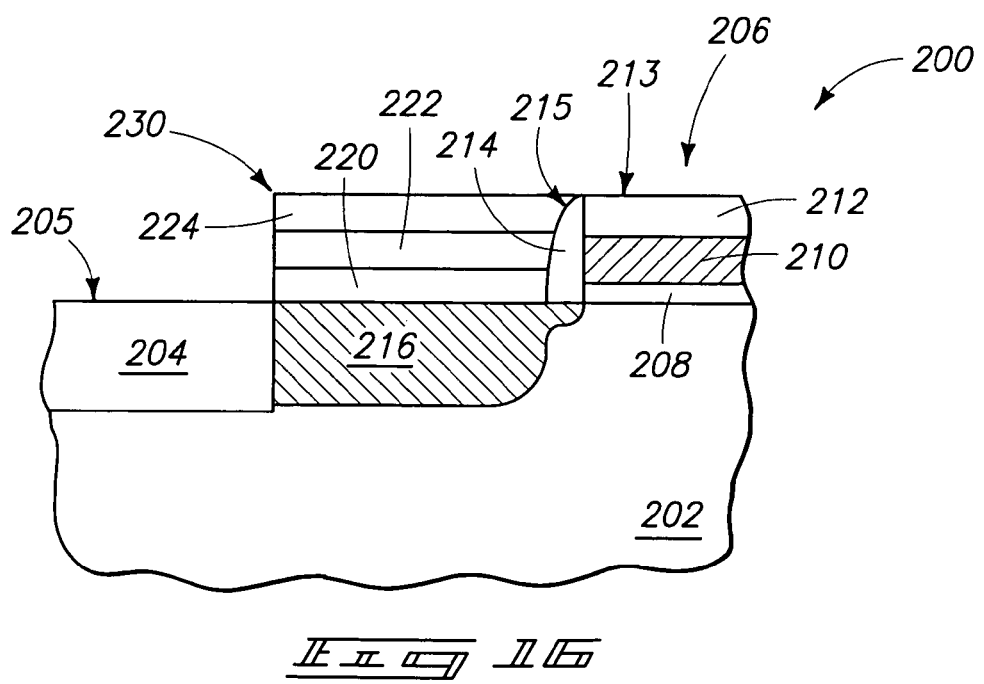
_FIG 16_

METHODS FOR DEPOSITION OF SEMICONDUCTOR MATERIAL

TECHNICAL FIELD

The invention pertains to methods for deposition of semiconductor material.

BACKGROUND OF THE INVENTION

There are numerous applications in which it is desired to selectively deposit semiconductor material onto a semiconductor surface relative to other surfaces. For instance, it can be desired to epitaxially form one or both of silicon and germanium on a semiconductor surface. A prior art method of epitaxially forming semiconductor material over a semiconductor surface is described with reference to FIGS. 1–3.

FIG. 1 shows a semiconductor wafer fragment 10 at a preliminary processing stage. Fragment 10 comprises a semiconductor substrate 12. Substrate 12 can comprise, consist essentially of, or consist of monocrystalline silicon. The silicon can be appropriately doped with one or more conductivity-enhancing dopants. For instance, the silicon can be lightly background doped with p-type dopant, and can comprise various conductively-doped diffusion regions (not shown) formed therein. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The term "semiconductor material" refers to a material comprising one or more of the semiconductive elements, such as, for example, a material comprising one or both of silicon and germanium.

An electrically insulative material 14 is formed over substrate 12. Material 14 can comprise, consist essentially of, or consist of silicon and one or both of oxygen and nitrogen. For instance, material 14 can comprise silicon dioxide, silicon nitride, and/or silicon oxynitride. In the illustrated example, substrate 12 has an upper surface 13, and material 14 is formed directly against (i.e., in physical contact with) the upper surface 13. Material 14 is patterned to have a gap 16 extending therethrough to the upper surface 13 of substrate 12. Material 14 has exposed surfaces 15.

Referring to FIG. 2, a semiconductor material 18 is formed within gap 16 and also over the surfaces 15 of insulative material 14. Material 16 will typically comprise, consist essentially of, or consist of one or both of silicon and germanium. If material 16 comprises, consists essentially of, or consists of silicon, such material can be formed utilizing dichlorosilane, $H_2$ and HCl. The dichlorosilane provides a silicon source. The $H_2$ participates in the silicon deposition, and also can remove undesired oxides forming over the growing silicon. The HCl etches material 18 before the material can form a uniform layer over insulative material 14. Specifically, the material 18 nucleates over insulative material 14 to form small islands on surface 15, as shown. The HCl continuously etches material 18 from the small islands, and accordingly removes material 18 from the islands before the islands can merge to form a continuous layer. The HCl is also thought to remove material 18 which is growing over surface 13 (the shown material 18 within gap 16), but such removal is too slow to prevent the layer of material 18 from forming within gap 16. Accordingly, the HCl effectively creates a selective deposition of material 18 over the surface 13 of semiconductor material 12 relative to the surfaces 15 of insulative material 14. The HCl can be replaced with $Cl_2$ in some aspects of the prior art.

FIG. 3 shows construction 10 at the conclusion of the epitaxial growth, and shows that the semiconductor material 18 has been selectively formed over surface 13 of semiconductor substrate 12 relative to surfaces 15 of insulative material 14.

A problem with the processing of FIGS. 1–3 is that the utilization of HCl significantly slows the rate of deposition of semiconductor material 18 relative to a rate which would occur in the absence of the HCl. Accordingly, it is desired to develop deposition processes which can selectively form a semiconductor material over an exposed semiconductor substrate surface relative to exposed surfaces of non-semiconductor materials, and which have a higher rate than the processing sequence of FIGS. 1–3.

The processing sequence of FIGS. 1–3 is an exemplary prior art process. Other processes have been developed which are modifications of the process described with reference to FIGS. 1–3. For instance, in one modification a semiconductor precursor (such as, for example, dichlorosilane) is provided in combination with $H_2$ to form semiconductor material 18 over a surface of a semiconductor substrate and over surfaces of insulative materials. After the growth of the semiconductor material, HCl is provided to selectively remove the semiconductor material from over the insulative materials surfaces while leaving a layer of the semiconductor material over the semiconductor substrate surface. In some aspects, the cycling of deposition of semiconductor material, etching of semiconductor material from over insulative material surfaces, deposition of the material, etching of the material, etc., is repeated multiple times to form a semiconductor material to a desired thickness over a semiconductor substrate surface. A particular prior art methodology flows disilane for about 10 seconds, then $Cl_2$ for about 10 seconds, then $H_2$ for about 10 seconds, and repeats the process multiple times to form a semiconductor layer to a desired thickness over a semiconductor substrate surface.

FIGS. 4 and 5 illustrate another exemplary prior art application for selective formation of epitaxially-grown semiconductor material over a semiconductor substrate. Referring initially to FIG. 4, a wafer fragment 20 comprises a substrate 22. Substrate 22 can comprise the same construction as described previously relative to substrate 12 of FIG. 1, and accordingly can comprise monocrystalline silicon lightly-background doped with p-type dopant. Substrate 22 comprises an upper surface 23.

An isolation region 24 extends within substrate 22. Isolation region 24 can comprise, for example, a shallow trench isolation region, and accordingly can comprise silicon dioxide. Isolation region 24 comprises an upper surface 25.

A transistor gate 26 is formed over surface 23 of substrate 22. Transistor gate 26 comprises an insulative material 28, a conductive material 30, and an insulative cap 32. Insulative material 28 can comprise, for example, silicon dioxide, and can be referred to as pad oxide. Conductive material 30 can comprise, for example, one or more of metal, metal compounds and conductively-doped semiconductor material (such as, for example, conductively-doped silicon). Insulative cap 32 can comprise, consist essentially of, or consist of silicon together with one or both of oxygen and nitrogen. For instance, insulative cap 32 can comprise, consist essentially of, or consist of silicon dioxide, silicon nitride, or silicon oxynitride. Insulative cap 32 comprises an upper exposed surface 33.

An anisotropically-etched sidewall spacer 34 is along a sidewall of transistor gate 26. Spacer 34 can comprise, consist essentially of, or consist of silicon together with one or both of oxygen and nitrogen. Accordingly, spacer 34 can comprise, or consist essentially of, or consist of one or more of silicon dioxide, silicon nitride and silicon oxynitride. Spacer 34 has an exposed surface 35.

A conductively-doped diffusion region 36 extends within substrate 22 beside transistor gate 26. The conductively-doped diffusion region 36 and transistor gate 26 can be together incorporated into a transistor device.

Referring to FIG. 5, a semiconductor material 38 is formed over surface 23 of semiconductor substrate 22 selectively relative to surfaces 25 and 33 of insulative materials 24 and 32, respectively. Semiconductor material 38 can comprise, consist essentially of, or consist of one or both of silicon and germanium, and can be formed utilizing processing analogous to that described previously with reference to FIGS. 1–3. Accordingly, the semiconductor material can be formed by deposition from a semiconductor precursor in combination with an etch which removes the deposited material from over surfaces 25 and 33 while leaving the material over surface 23. An undesired consequence of the etch is that such rounds an outer corner of deposited material 38, as can be seen at a location 40 in the diagram of FIG. 5. The rounded outer corner can be referred to as a faceted corner, and can increase degradation of a transistor device component (with a common effect being p-channel degradation), and can also adversely affect an implant profile if a dopant is implanted either into or through semiconductor material 38. For instance, conductively-doped diffusion region 36 would sometimes be formed by an implant subsequent to formation of material 38 rather than being present prior to deposition of semiconductor material 38. The rounded faceted corner 40 could then adversely affect formation of the diffusion region 36.

The semiconductor material 38 of FIG. 5 can ultimately be conductively doped, and can be incorporated into, for example, an elevated source/drain region associated with a transistor device comprising gate 26.

Numerous problems are encountered during the processing described above with reference to FIGS. 1–5. Such problems include the faceted corner 40 and slow growth rate discussed previously. Another problem is that the deposition rate and quality can be sensitive to the amount of etchant (such as, for example, HCl) utilized during the deposition/etch processing, which can make it problematic to control wafer throughput and quality in a fabrication process. For instance, it is sometimes found that increasing HCl flow by 10% will decrease the growth rate of a deposited semiconductor material by about 20%. It would be desirable to develop deposition methods which alleviate, and preferably eliminate, some or all of the above-discussed problems.

SUMMARY OF THE INVENTION

In one aspect, the invention encompasses a method for deposition of semiconductor material. A substrate is provided within a reaction chamber. The substrate includes a first material and a second material, with the second material having a different composition than the first material. The first and second materials are exposed to a semiconductor material precursor under conditions in which growth of semiconductor material from the precursor comprises a lag phase prior to a growth phase. The conditions are also such that it takes longer for the growth phase to initiate on the second material than on the first material. A concentration of the precursor is pulsed into the chamber. The duration of the pulse is long enough for the growth phase to substantially occur on the first material, but not long enough for the growth phase to substantially occur on the second material.

In one aspect, the invention encompasses a method for deposition of a semiconductor material comprising one or both of silicon and germanium. A substrate is provided within a reaction chamber. The substrate has a first surface consisting essentially of one or more semiconductor materials and a second surface consisting of one or more electrically insulative materials. The first and second surfaces are exposed to at least one precursor selected from the group consisting of silicon-containing precursors and germanium-containing precursors to deposit a substance comprising one or both of silicon and germanium over the substrate. The exposure is under conditions in which deposition of the substance over the first and second surfaces comprises nucleation phase/growth phase dynamics, and under which it takes longer for the growth phase to initiate over the second surface than over the first surface. The exposure is conducted for a time long enough to substantially initiate the growth phase over the first surface but not long enough to substantially initiate the growth phase over the second surface. Thus, the substance is selectively formed over the first surface relative to the second surface.

BRIEF DESCRIPTION OF THE DRAWINGS

Preferred embodiments of the invention are described below with reference to the following accompanying drawings.

FIG. 15 is a view of the FIG. 13 wafer fragment shown at a processing stage subsequent to that of FIG. 14.

FIG. 16 is a view of the FIG. 13 wafer fragment shown at a processing stage subsequent to that of FIG. 15.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention is a recognition that the dynamics of growth of deposited semiconductor materials on different surfaces can differ, and that this can be taken advantage of for selective deposition on particular surfaces.

Figure 6:
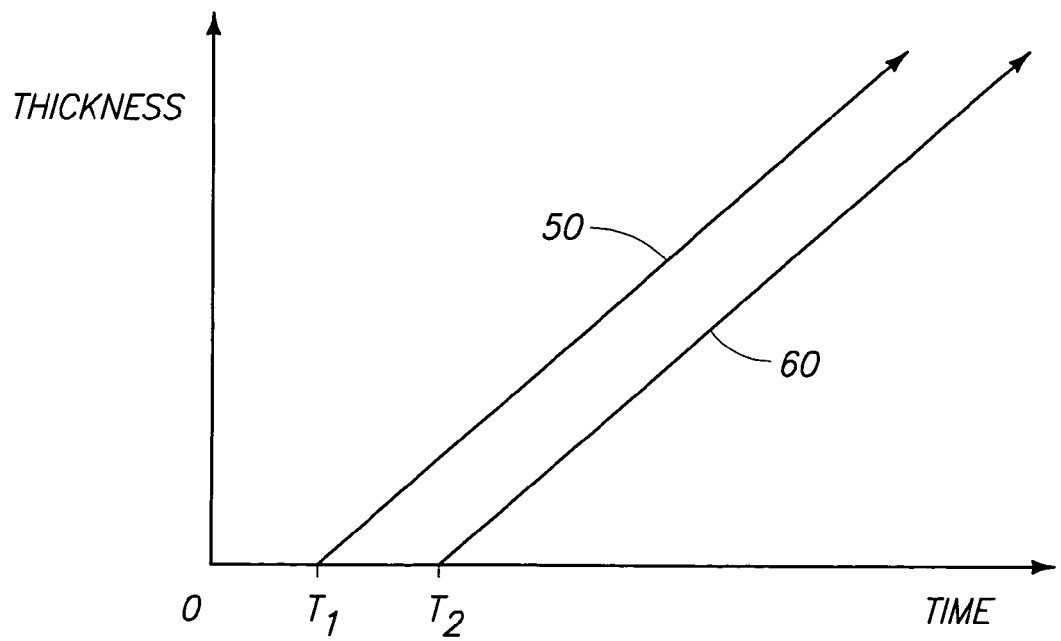
FIG. 6 is a graphical illustration of time versus thickness illustrating the growth dynamics for semiconductor material over two different surfaces under particular conditions.

FIG. 6 is a graphical illustration of the dynamics of growth of a deposited semiconductor material on two different surfaces. One of the surfaces is a semiconductor material (the line labeled 50), and the other is an insulative material (the line labeled 60). The insulative material can consist of silicon together with one or both of oxygen and nitrogen (i.e., can consist of silicon dioxide, silicon nitride or silicon oxynitride).

The rate of growth of the deposited semiconductor material over the surfaces is illustrated in the FIG. 6 graph as a change in thickness of the deposited material over time. Notably, the growth dynamics on both the semiconductor surface (line 50) and the insulative material surface (line 60) are similar in that both have a delay phase (lag phase) prior to a growth phase. Specifically, the thickness of the deposited material does not increase from the zero timepoint, but rather begins to increase after a lag phase. The lag phase for growth on the semiconductor material corresponds to time $T_1$, and the lag phase for the growth on the insulative material corresponds to time $T_2$.

The lag phase for growth of the deposited material on the semiconductor material is significantly shorter than the lag phase for the growth on the insulative material. In exemplary applications, the lag phase $T_1$ may be about 2 seconds, while the lag phase $T_2$ may be about 10 seconds. The particular length of a lag phase can be impacted by the deposition conditions utilized. For instance, if the deposition conditions comprise a semiconductor precursor in the absence of an etchant material (such as HCl), the lag phases will be relatively short. In contrast, if an etchant is present the lag phases will be extended. Particular conditions may extend one of the lag phases $T_1$ or $T_2$ more than the other. Such can reduce the interval between $T_1$ and $T_2$ in some cases, and in other cases can increase the interval between $T_1$ and $T_2$.

The lag phases $T_1$ and $T_2$ are believed to result from nucleation phase/growth phase dynamics during deposition of semiconductor material. Specifically, there is initially a nucleation phase of the deposited semiconductor material during which there is substantially no increase in the thickness of the material over an underlying surface. The nucleation phase then progresses to a growth phase, with the growth phase being defined as the phase in which there is a substantial increase in thickness of the deposited material. Accordingly, the lag phase times $T_1$ and $T_2$ correspond to the duration of the nucleation phases on the semiconductor surface and insulative material surface, respectively, and the lines 50 and 60 correspond to the growth phases on the semiconductor material surface and the insulative material surface, respectively. In some aspects, the growth phase can be considered a period of substantially linear increase in the thickness of a deposited material.

The increased lag phase over an insulative material surface relative to a semiconductor surface can be taken advantage of to selectively deposit a semiconductor material on the semiconductor surface relative to the insulative material surface. Specifically, an insulative material surface and a semiconductor material surface can both be exposed to a pulse of semiconductor precursor, but the pulse can be of a duration which exceeds the lag phase $T_1$ while being less than the lag phase $T_2$. Accordingly, there will be growth of semiconductor material on the semiconductor surface, but there will not be growth of semiconductor material on the insulative material surface.

Figure 7:
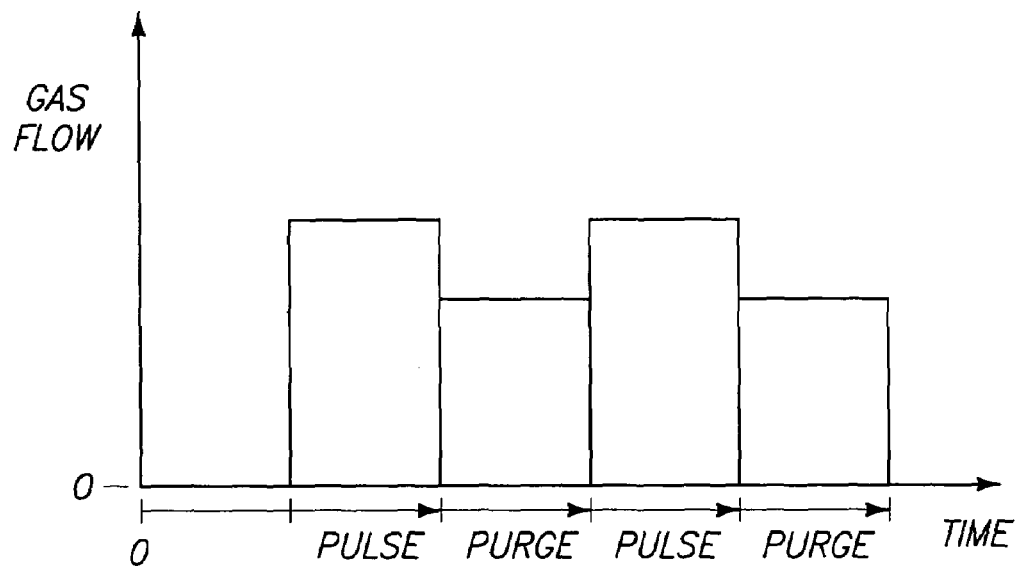
FIG. 7 is a graphical illustration of gas flow versus time illustrating an exemplary processing sequence of an aspect of the present invention.

An exemplary method is diagrammatically illustrated in FIG. 7. Specifically, FIG. 7 shows a graph of gas flow versus time for a pulse/purge sequence that can be utilized for growing semiconductor materials selectively over a semiconductor surface. Each pulse corresponds to flow of appropriate semiconductor material precursor within a reaction chamber to a sufficient concentration to grow semiconductor material over semiconductor surfaces and insulative material surfaces. The pulses are for a duration longer than the lag phase for growth on the semiconductor surface, but less than or equal to the lag phase for growth on the insulative material surface (i.e., of for a time longer than $T_1$ of FIG. 6, but no greater than the time $T_2$ of FIG. 6). After each pulse, the semiconductor material precursor is purged from within the reaction chamber.

In particular aspects, the semiconductor material which is deposited comprises, consists essentially of, or consists of one or both of silicon and germanium. In such aspects, the semiconductor material precursor utilized during the pulses can be selected from the group consisting of dichlorosilane, trichlorosilane, tetrachlorosilane, disilane, silane and germane.

The material utilized for the purge can comprise any suitable purge gas, and/or vacuum. If a purge gas is utilized, such can be inert relative to reaction with exposed substrate surfaces in the reaction chamber, or in some aspects can be reactive with one or more exposed materials in the reaction chamber. In particular aspects, the purge will comprise flowing a gas through a reaction chamber, with such gas containing $H_2$. The gas can comprise a halogen-containing component in addition to the $H_2$, such as, for example, $Cl_2$, or a halogen acid, such as, for example, HCl. If HCl is utilized during the purge, such can be present in the reaction chamber to a concentration of less than 0.1 volume percent. The utilization of a halogen-containing material during the purge can be advantageous in that it can remove nucleated semiconductor materials from over insulative surfaces. However, it can slow down a deposition process by also removing deposited semiconductor material from over a semiconductor surface. Accordingly, the invention also encompasses aspects in which a purge gas does not include etchants. In some aspects, the purge gas utilizes $H_2$ without any halogen-containing components, and specifically, without any chlorine-containing components.

If halogen-containing material, or other etchant, is desired in the reaction chamber, such can be provided in the chamber during the pulsing of the semiconductor material into the reaction chamber alternatively to, or in addition to, providing the etchant during the purging. In exemplary aspects, HCl is present in the reaction chamber during the pulse of semiconductor material into the chamber, and is present to a concentration of less than 0.1 volume percent. The HCl can advantageously remove semiconductor material nucleating on insulative surfaces. A disadvantage of including etchants with deposition precursors is that the etchants can slow down a deposition process, and accordingly in some aspects it can be advantageous to not have etchants (such as, for example, Cl) present during the pulse of semiconductor material into a reaction chamber.

Figure 8:
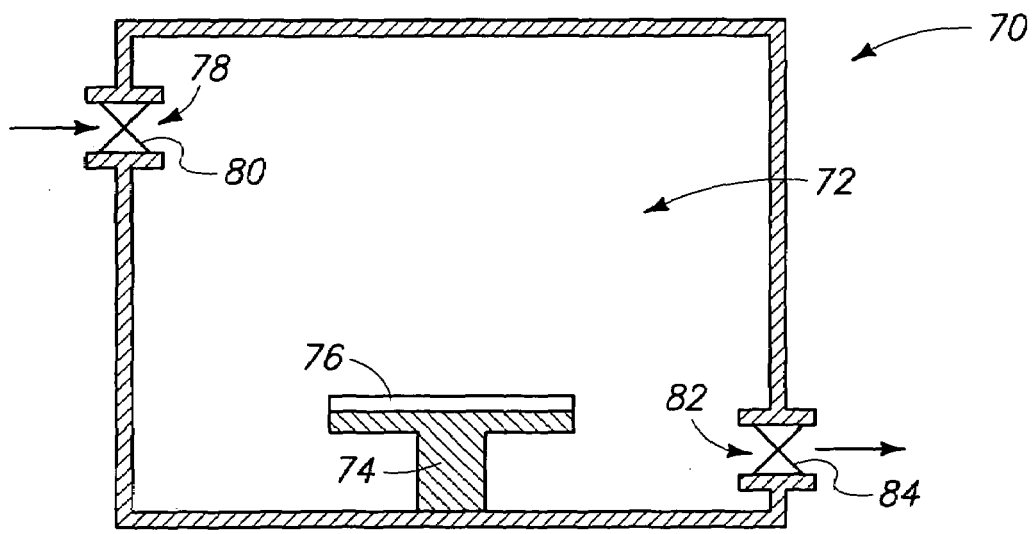
FIG. 8 is a diagrammatic, cross-sectional view of a reaction chamber configured for utilization in an exemplary aspect of the present invention.

FIG. 8 illustrates an exemplary reaction apparatus 70 that can be utilized in particular aspects of the present invention. Apparatus 70 comprises a chamber 72. A substrate holder 74 is within the chamber, and is shown holding an exemplary substrate 76. Substrate 76 can correspond to, for example, a semiconductor wafer, such as, for example, a monocrystalline silicon wafer. An inlet 78 extends into the chamber, and is blocked by a valve 80. An outlet 82 also extends into the chamber, and is blocked by a valve 84.

In operation, materials are flowed into chamber 72 through inlet 78, and expelled from chamber 72 through outlet 82. The materials flowed into chamber 72 can be suitable reactants during a pulse of precursor into the chamber, and can be suitable purge gases during a purge of materials from the chamber. Additionally, a vacuum (not shown) can be provided downstream of outlet 82 to assist in purging materials from within the chamber.

The apparatus 70 can be any suitable apparatus, including, for example, a chemical vapor deposition (CVD) apparatus, an atomic layer deposition (ALD) apparatus, a plasma-enhanced (PE) CVD or ALD apparatus, etc.

Figure 1:
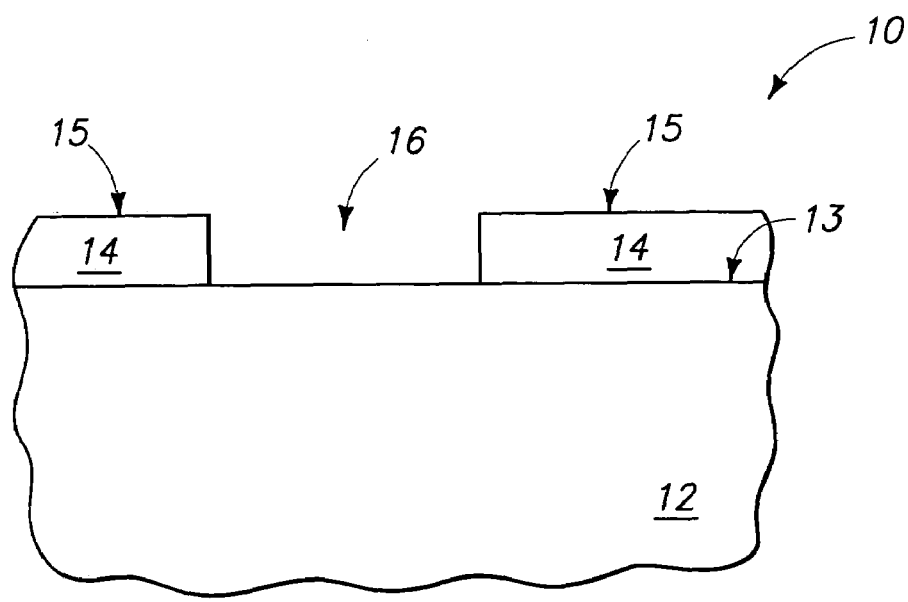
FIG. 1 is a diagrammatic, cross-sectional view of a semiconductor wafer fragment shown at a preliminary stage of a prior art process.
Figure 2:
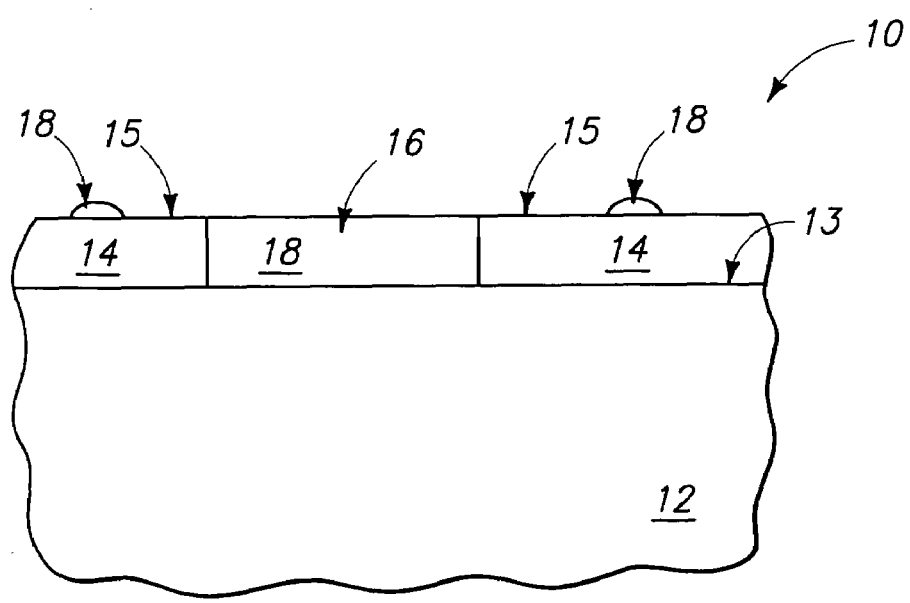
FIG. 2 is a view of the FIG. 1 wafer fragment shown at a prior art processing stage subsequent to that of FIG. 1.
Figure 3:
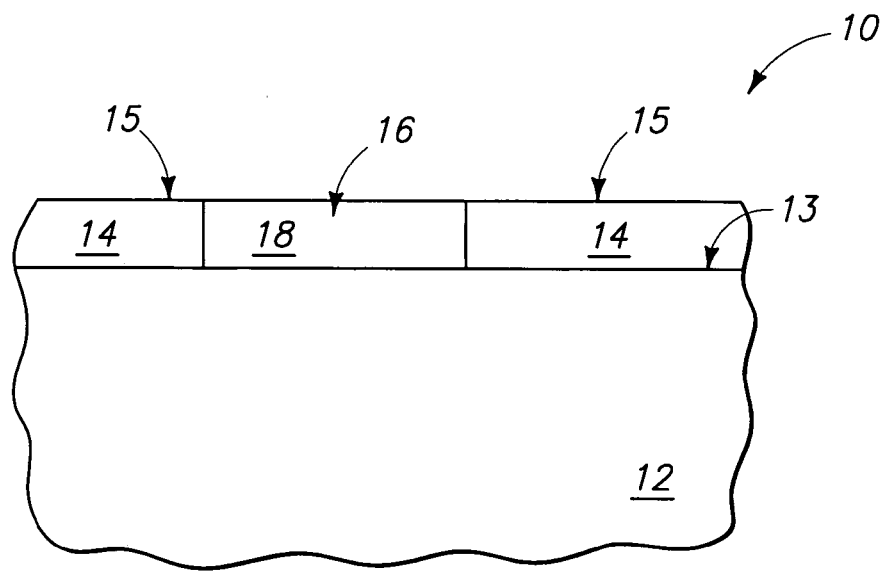
FIG. 3 is a view of the FIG. 1 wafer fragment shown at a prior art processing stage subsequent to that of FIG. 2.
Figure 9:
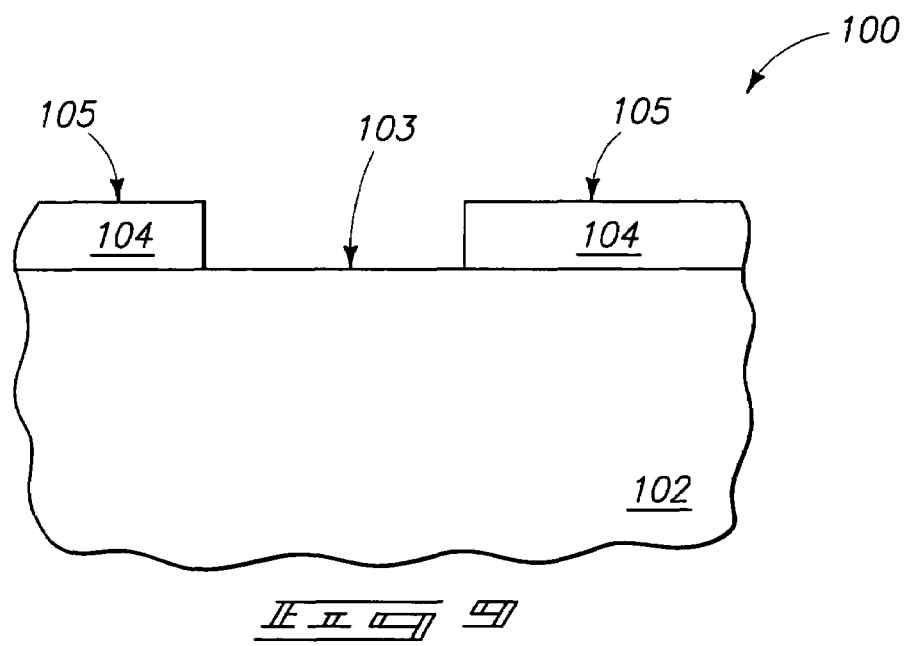
FIG. 9 is a diagrammatic, cross-sectional view of a wafer fragment at a preliminary processing stage of an exemplary aspect of the present invention.

FIGS. 9–12 illustrate an exemplary aspect of the invention. FIG. 9 shows a semiconductor wafer fragment 100 at a preliminary processing stage. Fragment 100 comprises a substrate 102 and an insulative material 104 over substrate 102. Substrate 102 can comprises identical materials to those discussed above for substrate 12 of FIG. 1. Accordingly, substrate 102 can comprise, consist essentially of, or consist of semiconductor materials, and in particular aspects will comprise, consist essentially of, or consist of one or both of silicon and germanium.

Substrate 102 comprises an upper surface 103. The portion of substrate 102 comprised by surface 103 can be monocrystalline or polycrystalline, and in particular aspects will comprise, consist essentially of, or consist of one or both of silicon and germanium in monocrystalline or polycrystalline form. The semiconductor material of surface 103 can be doped or undoped. Specifically, surface 103 can be comprised by a conductively-doped diffusion region (not shown) in particular aspects of the invention, or can be comprised by undoped semiconductor material in other aspects of the invention.

Insulative material 104 can comprise identical materials to those discussed above for material 14 of FIG. 1, and accordingly can comprise, consist essentially of, or consist of silicon in combination with one or both of nitrogen and oxygen.

Insulative material 104 comprises a surface 105. In particular aspects, surface 105 can comprise, consist essentially of, or consist of one or more of silicon dioxide, silicon nitride and silicon oxynitride. Materials 102 and 104 can be referred to as first and second materials, respectively, in the discussion that follows; and surfaces 103 and 105 can be referred to as first and second surfaces respectively.

In exemplary aspects of the invention, the wafer comprising fragment 100 is provided within a reaction chamber, such as, for example, the chamber above with reference to FIG. 8, and first and second surfaces 103 and 105 are exposed to at least one semiconductor material precursor. The surfaces are exposed to the precursor under conditions in which growth of semiconductor material from the precursor over the first and second materials 102 and 104 will comprise a lag phase prior to a growth phase, and under which it takes longer for the growth phase to initiate on surface 105 of material 104 than on surface 103 of material 102. The precursor is injected within the chamber to a sufficient concentration for growth of semiconductor material from the precursor on both first surface 103 and second surface 105. However, the precursor concentration is maintained within the chamber for a duration only long enough for the growth phase to substantially occur on first surface 103, and not long enough for the growth phase to substantially occur on second surface 105. A growth phase is considered to have "substantially occurred" on a surface if a detectable layer of uniform thickness has formed on the surface, and not if nucleated islands are the only deposition on the surface. The duration that the precursor concentration is maintained in the chamber can be considered a pulse of the precursor within the chamber.

In some aspects, the deposition of semiconductor material on surfaces 103 and 105 can be considered to have a first activation time relative to surface 103, and a second activation time relative to surface 105. The term "activation time" refers to the time of the lag phase associated with growth of semiconductor material over the surfaces, and specifically is the time which elapses before the growth phase initiates. The activation time relative to surface 105 (the second activation time) is longer than the activation time relative to surface 103 (the first activation time). The semiconductor material precursor is pulsed into the chamber for a time longer than the first activation time and no greater than the second activation time. The pulse thus selectively deposits semiconductor material over the first surface 103 relative to the second surface 105.

The precursor utilized for deposition of semiconductor material over surface 103 can comprise at least one precursor selected from the group of silicon-containing precursors and germanium-containing precursors. Accordingly, the semiconductor material deposited over surface 103 can comprise, consist essentially of, or consist of one or both of silicon and germanium. If the semiconductor material comprises both silicon and germanium, it can be referred to as silicon/germanium. In particular aspects, the precursor can comprise one or more materials selected from the group consisting of dichlorosilane, trichlorosilane, tetrachlorosilane, disilane, silane and germane.

Figure 10:
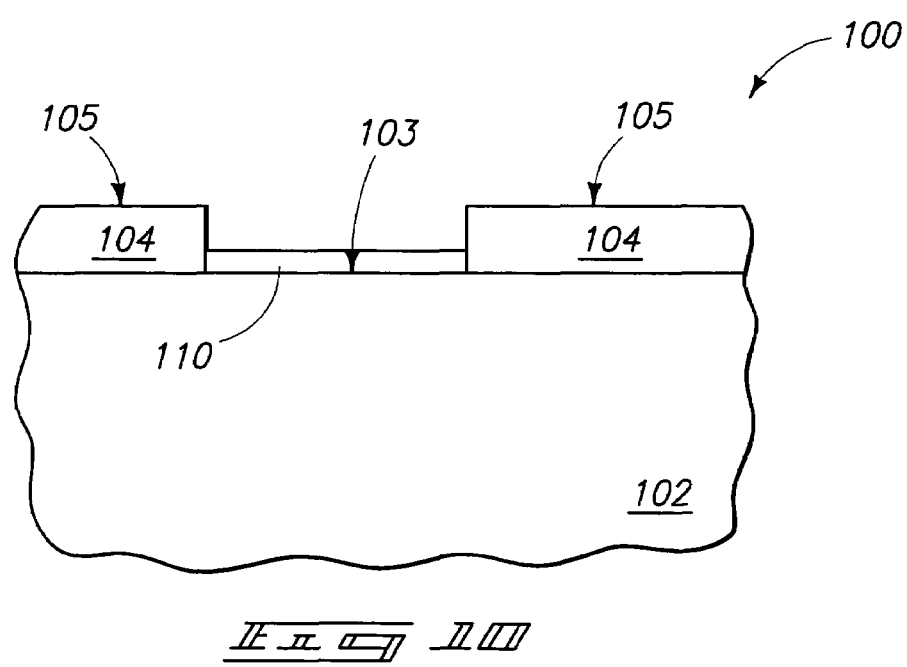
FIG. 10 is a view of the FIG. 9 wafer fragment shown at a processing stage subsequent to that of FIG. 9.

FIG. 10 shows fragment 100 after exposure of surfaces 103 and 105 to the semiconductor material precursor. A semiconductor material 110 is selectively formed over surface 103 relative to surface 105. Semiconductor material 110 can comprise any suitable semiconductor material, and in particular aspects will comprise, consist essentially of, or consist of one or both of silicon and germanium.

The deposition of material 110 can be, in some aspects, considered a "blanket" deposition in that surfaces 103 and 105 are both exposed to precursor, even though the deposition is selective for the particular surface 103.

The formation of material 110 can be accomplished utilizing the various conditions discussed above with reference to FIGS. 6 and 7. Accordingly, the formation of material 110 can be accomplished utilizing a semiconductor material precursor alone in the reaction chamber, or in combination with a halogen-containing material. Exemplary halogen-containing materials are halogen-containing acids (for example, HCl), and diatomic halogen molecules (for example, $Cl_2$). If HCl is present in the reaction chamber during deposition of semiconductor material 110, the HCl will preferably be present in the chamber to a concentration of less than or equal to about 0.1 volume percent (i.e., the HCl will be present to a concentration of from greater than 0 volume percent to less than or equal to about 0.1 volume percent).

In the shown aspect of the invention, material 110 is deposited to a thickness which is less than the initial thickness of material 104, and accordingly material 110 only partially fills a gap extending through material 104. Material 110 can be thick enough at the processing stage of FIG. 10 for particular applications. For other applications, it can be desired that a thicker amount of semiconductor material be provided. An exemplary thickness of material 110 is from about 10 Å to about 5000 Å.

Figure 11:
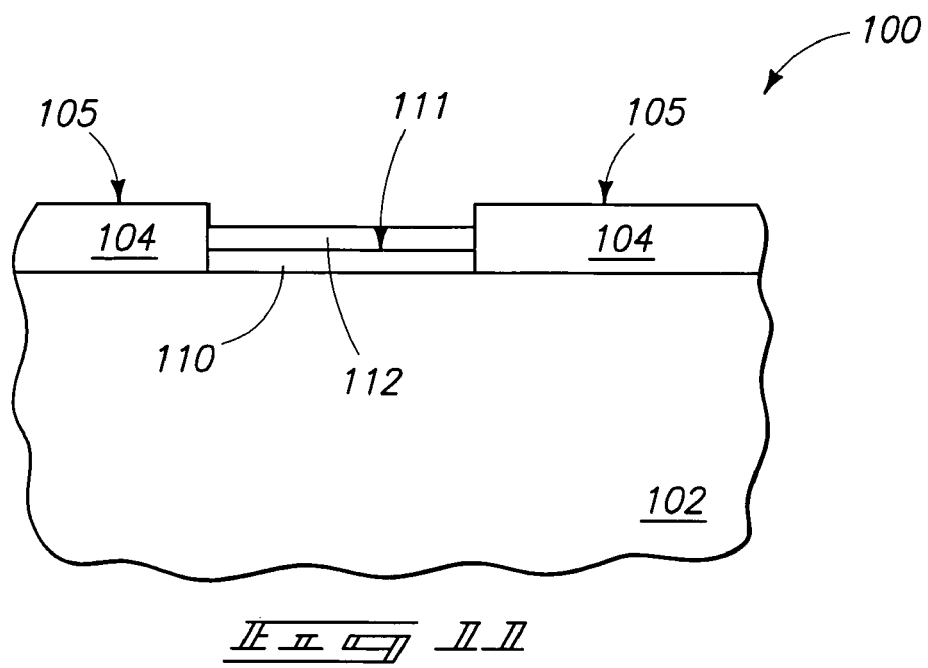
FIG. 11 is a view of the FIG. 9 wafer fragment shown at a processing stage subsequent to that of FIG. 10.

FIG. 11 shows fragment 100 after another pulse of semiconductor material is utilized to selectively form a layer 112 of semiconductor material over the layer 110. The conditions utilized for forming layer 112 can be similar to, or identical to, the conditions utilized for forming semiconductor material 110. Specifically, it is noted that semiconductor material 110 comprises a surface 111 of semiconductor material. Accordingly, the conditions described above with reference to FIGS. 6 and 7 can be utilized for selectively forming semiconductor material over surface 111 relative to the surface 105 of material 104.

Figure 12:
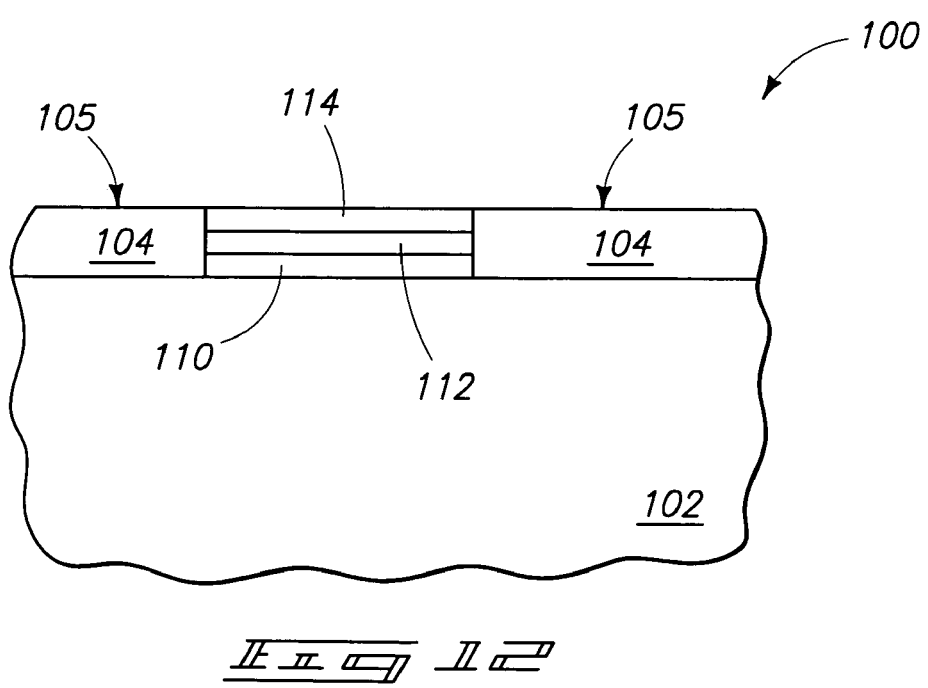
FIG. 12 is a view of the FIG. 9 wafer fragment shown at a processing stage subsequent to that of FIG. 11.

Layers 110 and 112 can be considered to have been formed by the pulse/purge cycle of FIG. 7. Such pulse/purge cycle can be repeated multiple times to deposit a desired thickness of semiconductor material. FIG. 12 shows construction 100 after a layer 114 of semiconductor material is selectively formed over layer 112 relative to surface 105 of material 104.

Layers 110, 112 and 114 can comprise the same semiconductor material compositions as one another, or different compositions, and can be together considered to be a stack of semiconductor material layers. At least two of the layers will comprise different compositions relative to one another if different semiconductor material precursors, or semiconductor material precursor combinations, are utilized during formation of one of the layers than are utilized during formation of another of the layers. The layers 110, 112 and 114 can all be crystalline in particular aspects of the invention. Further, in some aspects of the invention layers 110, 112 and 114 can be epitaxially grown single crystal materials.

Figure 4:
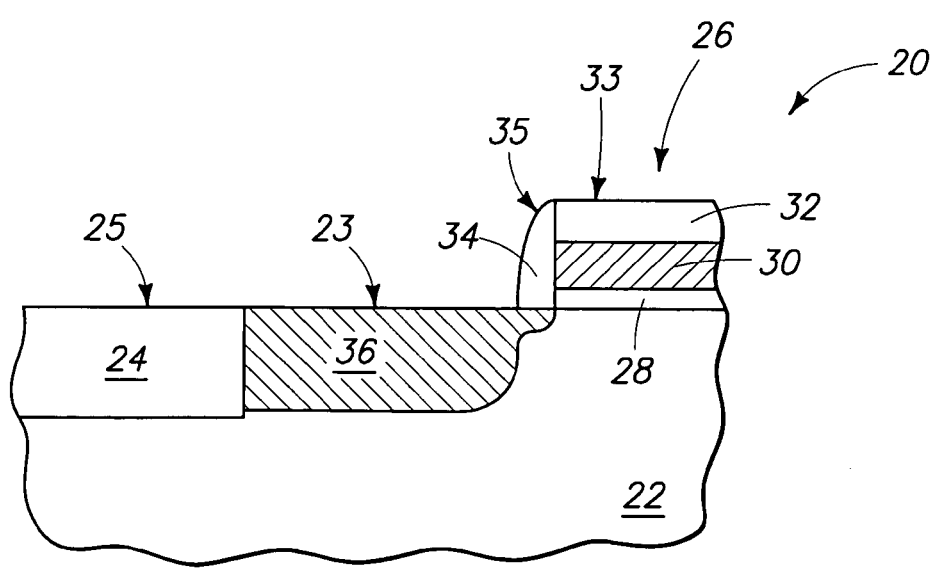
FIG. 4 is a diagrammatic, cross-sectional view of a semiconductor wafer fragment shown at a preliminary processing stage of a second prior art process.
Figure 13:
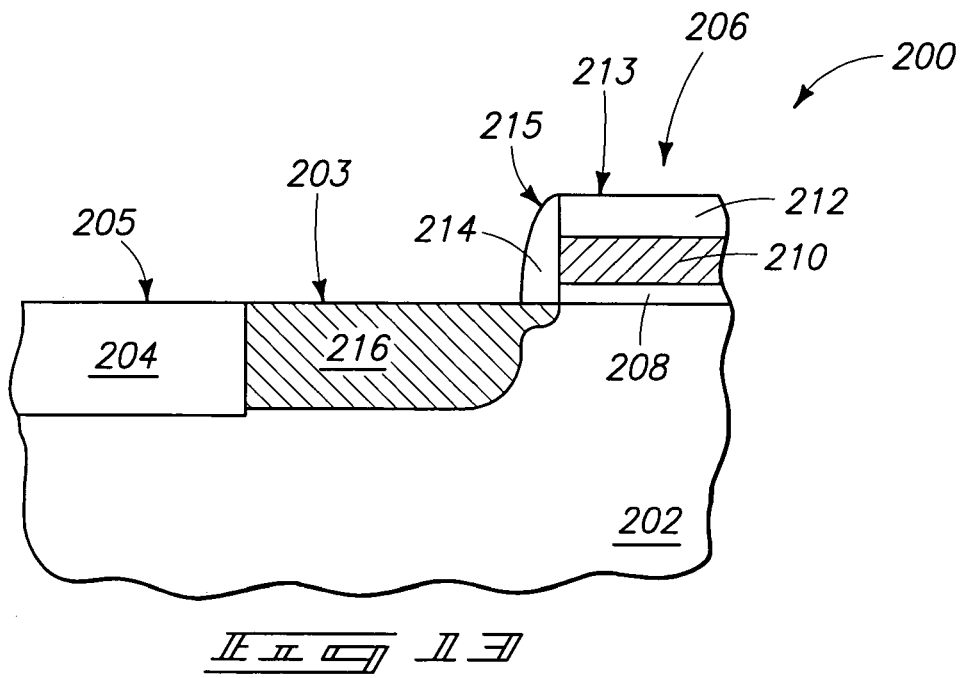
FIG. 13 is a diagrammatic, cross-sectional view of a semiconductor wafer fragment at a preliminary processing stage of a second embodiment aspect of the present invention.

FIGS. 13–17 illustrate another aspect of the invention. FIG. 13 shows a semiconductor wafer fragment 200 comprising a substrate 202, an isolation region 204 extending into the substrate, and a transistor gate 206 over the substrate. Substrate 202, isolation region 204 and transistor gate 206 can comprise the same compositions as discussed above with reference to FIG. 4 for substrate 22, isolation region 24 and transistor gate 26, respectively. Accordingly, substrate 202 can comprise, consist essentially of, or consist of monocrystalline semiconductor material, such as, for example, monocrystalline silicon; isolation region 204 can comprise, consist essentially of, or consist of silicon dioxide; and transistor gate 206 can comprise layers 208, 210 and 212 having identical compositions to layers 28, 30 and 32 described previously.

An anisotropically etched sidewall spacer 214 is adjacent a sidewall of transistor gate 206, and can comprise an identical composition as discussed above for spacer 34 of FIG. 4.

A conductively-doped diffusion region 216 extends within substrate 202 proximate gate 206, and can comprise an identical composition as the diffusion region 36 discussed above with reference to FIG. 4.

In an exemplary aspect, substrate 202 comprises an upper surface 203 consisting essentially of, or consisting of semiconductor material; isolation region 204 comprises an upper surface 205 consisting essentially of or consisting of, for example, silicon dioxide; layer 212 comprises an upper surface 213 consisting essentially of, or consisting of, for example, silicon nitride, silicon dioxide and/or silicon oxynitride; and sidewall spacer 214 comprises a surface 215 consisting essentially of, or consisting of, for example, silicon nitride, silicon dioxide, and/or silicon oxynitride.

Figure 14:
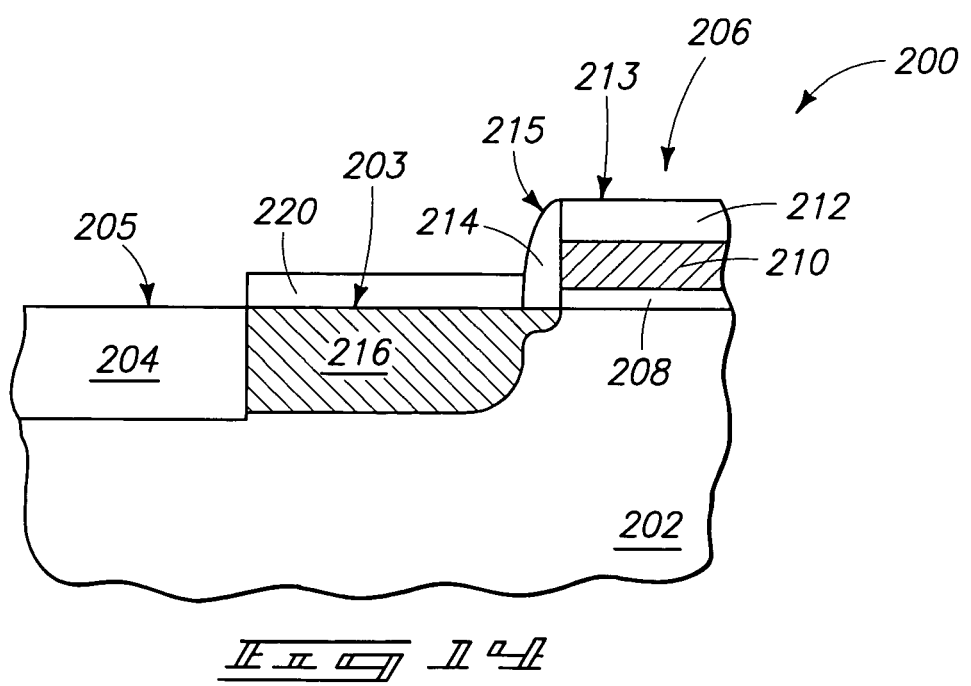
FIG. 14 is a view of the FIG. 13 wafer fragment shown at a processing stage subsequent to that of FIG. 13.

Construction 200 can be exposed to the conditions discussed above with reference to FIGS. 6 and 7 to selectively grow semiconductive material over surface 203 relative to surfaces 205, 213 and 215. FIG. 14 shows construction 200 after growth of semiconductor material 220 selectively over surface 203.

An upper surface of semiconductor material 220 can be utilized as a substrate in subsequent processing to form another semiconductor material 222 over material 220 as shown in FIG. 15. Additionally, an upper surface of semiconductor material 222 can be utilized as a substrate for selectively forming another semiconductor material 224 as shown in FIG. 16. The layers 220, 222 and 224 can all be crystalline in particular aspects of the invention, and in some aspects can be epitaxially grown single crystal materials.

Figure 5:
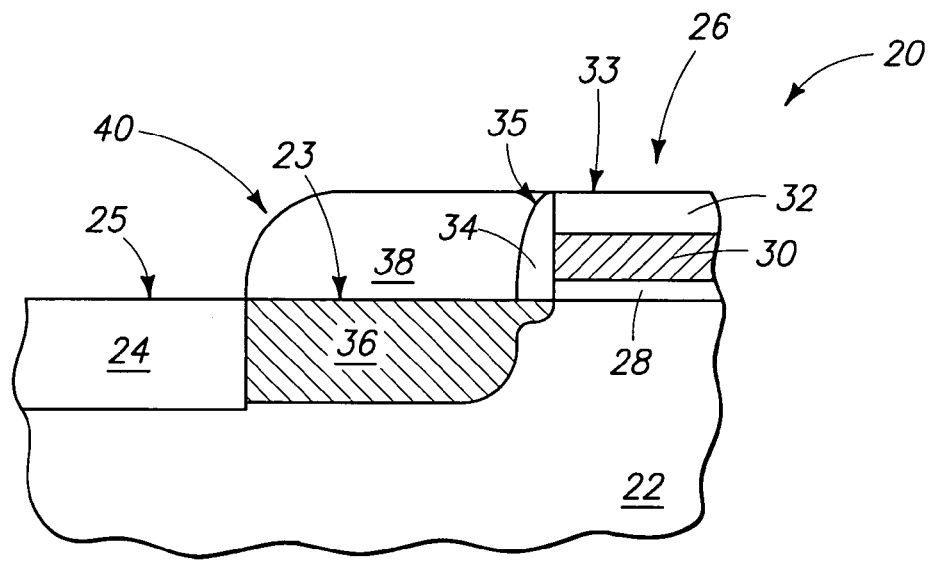
FIG. 5 is a view of the FIG. 4 wafer fragment shown at a prior art processing stage subsequent to that of FIG. 4.

The structure 200 of FIG. 16 advantageously has a substantially square outer corner 230 at the region where the problematic rounded corner 40 occurred in the prior art structure of FIG. 5. Accordingly, the problems discussed above relative to FIG. 5 can be alleviated, and in particular aspects even entirely overcome, utilizing the processing of the present invention.

Figure 17:
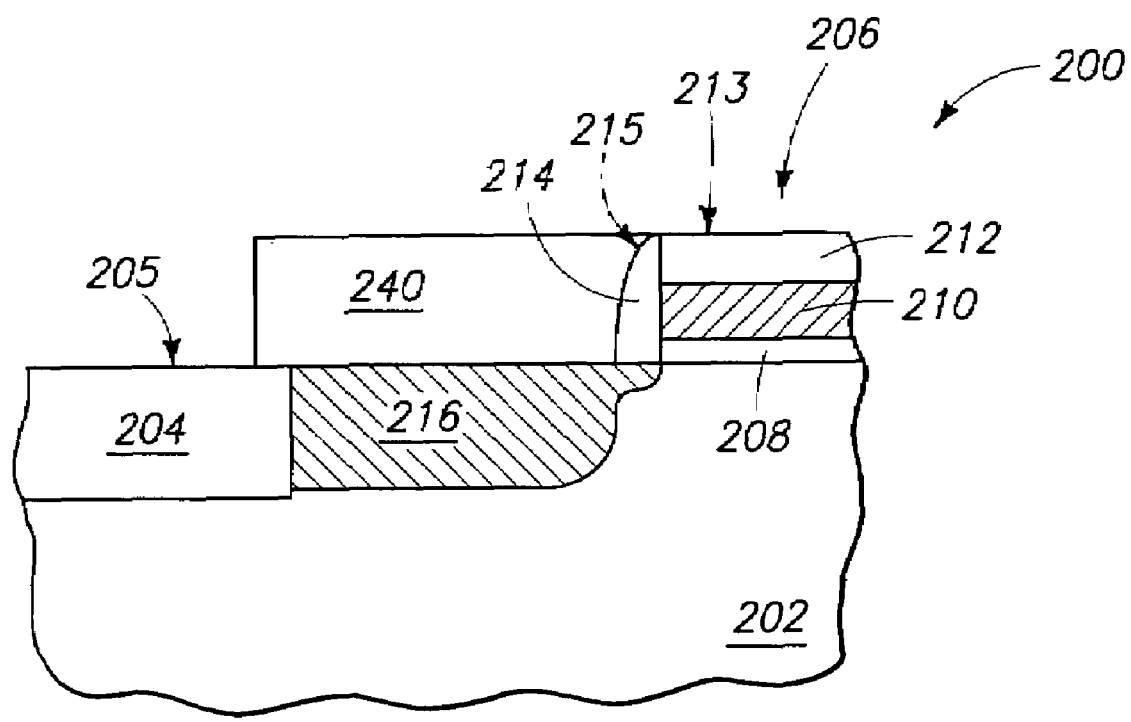
FIG. 17 is a view of the FIG. 13 wafer fragment shown at the processing stage of FIG. 16 in accordance with an exemplary aspect of the invention.

The structure of FIG. 16 shows semiconductor materials 220, 222 and 224 as separate distinct layers from one another. As discussed previously, the invention includes processing in which the multiple layers formed through sequential pulse/purge cycles of the type described with reference to FIG. 7 have different compositions relative to one another, and such would form a structure of the type formed in FIG. 16. However, as was also discussed above, the invention encompasses processes in which the multiple pulse/purge cycles of the type described with reference to FIG. 7 form layers having the same composition as one another. In such aspect, the layers 220, 222 and 224 of FIG. 16 would not be distinguishable from one another in the structure of FIG. 16. FIG. 17 shows construction 200 at the processing stage of FIG. 16 in an aspect in which layers 220, 222 and 224 of FIG. 16 have the same composition as one another and merge to form a single semiconductor material 240. FIG. 17 also illustrates another exemplary advantageous aspect of the present invention in which there has been lateral overgrowth of semiconductor material 240 over isolation region 204. Such lateral overgrowth can help to reduce p-channel degradation relative to transistor devices lacking the overgrowth.

The invention described herein can provide numerous advantages relative to prior art processes. For instance, the invention can reduce the faceting described with reference to FIG. 5; can increase lateral overgrowth of a semiconductor material as described above with reference to FIG. 17; can reduce processing time due to removal of etchant, or decreasing of etchant concentration relative to prior art processes; can increase the robustness of processes by removing the etchant that prior art processing was undesirably sensitive to; and can increase selectivity for semiconductor formation over semiconductor surfaces relative to other surfaces by substantially avoiding, and in some cases entirely avoiding, detectable growth of semiconductor materials on undesired surfaces, such as, for example, surfaces comprising silicon nitride, silicon dioxide, and/or silicon oxynitride.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method for deposition of semiconductor material, comprising:
   providing a substrate, the substrate comprising a first material and a second material;
   exposing the first and second materials to at least one semiconductor material precursor under conditions in which growth of semiconductor material from the at least one precursor over the first and second materials comprises a lag phase period prior to a growth phase, and under which it takes longer for the growth phase to initiate on the second material than on the first material;
   the exposing being conducted for long enough for the growth phase to occur on the first material, but not for long enough for the growth phase to substantially occur on the second material;
   the exposing being conducted in a reaction chamber and comprising a pulse of the at least one precursor into the chamber followed by a purge to remove the at least one precursor substantially entirely from within the chamber;
   a sequence comprising two or more of the pulses being utilized to form a thickness of semiconductor material; and
   a different semiconductor precursor being flowed into the chamber during one of the two or more pulses relative to another of the two or more pulses.

2. The method of claim 1 wherein said thickness is from about 10 Å to about 5000 Å.

3. The method of claim 2 wherein the semiconductor material is a single crystal material epitaxially grown over the first material.

4. The method of claim 1 wherein the purge utilizes one or more of $H_2$, $Cl_2$ and HCl.

5. The method of claim 4 wherein the purge utilizes $H_2$ without a chlorine-containing component.

6. The method of claim 1 further comprising flowing an etchant into the reaction chamber during at least some of the exposing, and wherein the etchant is suitable for etching some of the semiconductor material.

7. The method of claim 1 wherein no etchant suitable for etching the semiconductor material is within the reaction chamber during the exposing.

8. The method of claim 1 further comprising flowing a halogen-containing material into the reaction chamber during at least some of the exposing.

9. The method of claim 8 wherein the halogen of the halogen-containing material is Cl.

10. The method of claim 8 wherein the halogen-containing material is HCl and is present in the reaction chamber to a concentration of less than or equal to about 0.1 volume percent.

11. The method of claim 1 wherein the semiconductor material consists essentially of one or both of silicon and germanium.

12. The method of claim 1 wherein the semiconductor material consists essentially of silicon.

13. The method of claim 1 wherein the semiconductor material consists essentially of germanium.

14. The method of claim 1 wherein the semiconductor material consists of one or both of silicon and germanium.

15. The method of claim 1 wherein the semiconductor material consists of silicon.

16. The method of claim 1 wherein the semiconductor material consists of germanium.

17. The method of claim 1 wherein the first material comprises a semiconductor material and wherein the second material comprises an electrically insulative material.

18. The method of claim 17 wherein the first material is monocrystalline or polycrystalline.

19. The method of claim 17 wherein the first material consists essentially of doped or undoped silicon.

20. The method of claim 19 wherein the second material consists essentially of silicon and one or both of oxygen and nitrogen.

21. The method of claim 17 wherein the first material consists of doped or undoped silicon.

22. The method of claim 21 wherein the second material consists of silicon and one or both of oxygen and nitrogen.

23. The method of claim 17 wherein the first material consists essentially of doped or undoped germanium.

24. The method of claim 23 wherein the second material consists essentially of silicon and one or both of oxygen and nitrogen.

25. The method of claim 17 wherein the first material consists of doped or undoped germanium.

26. The method of claim 25 wherein the second material consists of silicon and one or both of oxygen and nitrogen.

27. The method of claim 17 wherein the first material consists essentially of doped or undoped silicon/germanium.

28. The method of claim 27 wherein the second material consists essentially of silicon and one or both of oxygen and nitrogen.

29. The method of claim 17 wherein the first material consists of doped or undoped silicon/germanium.

30. The method of claim 29 wherein the second material consists of silicon and one or both of oxygen and nitrogen.

31. A method for deposition of semiconductor material, comprising:
   providing a substrate within a reaction chamber, the substrate including a first material with a first surface and including a second material with a second surface;
   providing a semiconductor material precursor having a first activation time associated therewith for forming semiconductor material over the first surface and a second activation time associated therewith for forming semiconductor material over the second surface, the second activation time being longer than the first activation time;

providing a pulse of the semiconductor material precursor within the chamber, the pulse being maintained in the chamber for a time longer than the first activation time and no greater than the second activation time to selectively form semiconductor material from the semiconductor material precursor over the first surface relative to the second surface;

two or more of the pulses being sequentially utilized to form a stack of semiconductor material; and a different semiconductor precursor being flowed into the chamber during one of the two or more pulses relative to another of the two or more pulses.

32. The method of claim 31 wherein the semiconductor material formed from the precursor deposits over the first surface as a crystalline layer.

33. The method of claim 32 wherein at least one of the purges utilizes $H_2$ without a chlorine-containing component.

34. The method of claim 31 wherein each of the two or more pulses is followed with a purge utilizing one or more of $H_2$, $Cl_2$ and HCl to remove the semiconductor material precursor substantially entirely from within the chamber.

35. The method of claim 31 further comprising flowing a halogen acid into the chamber during at least some of the time of at least one of the pulses of the semiconductor material precursor.

36. The method of claim 35 wherein the halogen acid is HCl.

37. The method of claim 35 wherein the halogen acid is HCl and is present in the reaction chamber to a concentration of less than or equal to about 0.1 volume percent.

38. The method of claim 31 wherein substantially no halogen acid is present within the chamber during the time of at least one of the pulses of the semiconductor material precursor.

39. The method of claim 31 wherein the semiconductor material precursors are selected from the group consisting of dichlorosilane, trichlorosilane, tetrachlorosilane, disilane, silane and germane.

40. The method of claim 31 wherein the semiconductor material of the semiconductor material precursors is silicon.

41. The method of claim 31 wherein the semiconductor material of the semiconductor material precursors is germanium.

42. The method of claim 31 wherein the first surface consists essentially of doped or undoped silicon.

43. The method of claim 42 wherein the second surface consists essentially of silicon and one or both of oxygen and nitrogen.

44. The method of claim 31 wherein the first material consists of doped or undoped silicon.

45. The method of claim 44 wherein the second material consists of silicon and one or both of oxygen and nitrogen.

46. The method of claim 31 wherein the first material consists essentially of doped or undoped germanium.

47. The method of claim 46 wherein the second material consists essentially of silicon and one or both of oxygen and nitrogen.

48. The method of claim 31 wherein the first material consists of doped or undoped germanium.

49. The method of claim 48 wherein the second material consists of silicon and one or both of oxygen and nitrogen.

50. The method of claim 31 wherein the first material consists essentially of doped or undoped silicon/germanium.

51. The method of claim 50 wherein the second material consists essentially of silicon and one or both of oxygen and nitrogen.

52. The method of claim 31 wherein the first material consists of doped or undoped silicon/germanium.

53. The method of claim 52 wherein the second material consists of silicon and one or both of oxygen and nitrogen.

* * * * *